(12) United States Patent
Wang

(10) Patent No.: US 7,015,577 B2
(45) Date of Patent: Mar. 21, 2006

(54) FLIP CHIP PACKAGE CAPABLE OF MEASURING BOND LINE THICKNESS OF THERMAL INTERFACE MATERIAL

(75) Inventor: Sung-Fei Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/895,052

(22) Filed: Jul. 21, 2004

(65) Prior Publication Data

US 2006/0017155 A1    Jan. 26, 2006

(51) Int. Cl.
*H01L 23/10* (2006.01)
*H01L 23/34* (2006.01)

(52) U.S. Cl. ............ 257/707; 257/706
(58) Field of Classification Search ........ 257/706, 257/707, 704, 708, 712, 713; 361/697, 709, 361/702

See application file for complete search history.

(56) References Cited

U.S. PATENT DOCUMENTS

| | | | | |
|---|---|---|---|---|
| 5,835,355 A | * | 11/1998 | Dordi | 361/760 |
| 6,278,182 B1 | * | 8/2001 | Liu et al. | 257/712 |
| 6,433,420 B1 | * | 8/2002 | Yang et al. | 257/712 |
| 6,654,248 B1 | * | 11/2003 | Fishley et al. | 361/704 |
| 6,882,041 B1 | * | 4/2005 | Cheah et al. | 257/704 |
| 6,891,259 B1 | * | 5/2005 | Im et al. | 257/687 |
| 2003/0183909 A1 | * | 10/2003 | Chiu | 257/667 |

FOREIGN PATENT DOCUMENTS

TW    508778    11/2002

* cited by examiner

*Primary Examiner*—S. V. Clark
(74) *Attorney, Agent, or Firm*—Troxell Law Office, PLLC

(57) ABSTRACT

A flip chip package includes a substrate, a flip chip, a thermal interface material and a heat sink. The flip chip is mounted on the substrate. The thermal interface material is applied on the back surface of the flip chip. The back surface of the flip chip includes a region uncovered by the thermal interface material. The opening exposes the uncover region of the back surface of the flip chip for measuring the height of the back surface. Also the opening has an inner sidewall above the back surface for fillet bonding of the thermal interface material. Therefore the bond line thickness (BLT) of the thermal interface material can be measured and calculated.

17 Claims, 3 Drawing Sheets

FLIP CHIP PACKAGE CAPABLE OF MEASURING BOND LINE THICKNESS OF THERMAL INTERFACE MATERIAL

FIELD OF THE INVENTION

The present invention relates to a flip chip package, and in particular to a flip chip package capable of measuring the bond line thickness (BLT) of thermal interface material between a heat sink and a flip chip, also capable of observing the distribution of the thermal interface material on the back surface of the flip chip.

BACKGROUND OF THE INVENTION

It is well known that the flip chip package is lighter, thinner, shorter, and smaller than other packages. Furthermore, the flip chip package includes a flip chip which is flip-chip mounted on a substrate via bumps so that the signal path from the flip chip to the substrate becomes shorter for high-speed applications. However, the heat generated from the flip chip becomes a serious problem in high-speed operation. Therefore, it is important to solve the heat dissipation problem in a flip chip package. R.O.C. Taiwan Patent No. 508,778 entitled "Package structure of semiconductor chip" discloses a conventional thermal-enhanced flip chip package. Referring to FIG. 1, the flip chip package 10 includes a flip chip 11, a substrate 12 and a heat sink 13. The flip chip 11 is mounted on the upper surface of the substrate 12 via a plurality of bumps 14. A plurality of solder balls 17 are placed on the bottom surface of the substrate 12 for outer electrical connection. To enhance the heat dissipation of the package 10, a heat sink 13 is attached to the top of the flip chip 11. However, in order to improve the thermal coupling effect of the heat sink 13, a thermal interface material 15 is applied between the heat sink 13 and the flip chip 11. The bond line thickness (BLT) and the volume of the thermal interface material 15 should be well-controlled so that heat can be rapidly conducted from the flip chip 11 to the heat sink 13. Then, the heat sink 13 can dissipate Heat to the outside more effectively and efficiently. Since the thickness of the thermal interface material 15 will vary with the attaching pressure of the heat sink 13, therefore, the BLT of the thermal interface material 15 should be measured first, then the volume of the thermal interface material 15 and the parameter of the attaching pressure of the heat sink 13 can be determined. According to a conventional BLT measurement method, the flip chip package 10 will go through destructive experiments because the thermal interface material 15 has been pre-heated and cured inside the heat sink 13. Afterward, the heat sink 13 is removed from the flip chip package to measure the BLT of the thermal interface material 15 and its distribution. Under this kind of destructive measurement, the sampling is very limited and very time-consuming.

SUMMARY OF THE INVENTION

The first purpose of the present invention is to provide a flip chip package capable of measuring the bond line thickness (BLT) of the thermal interface material. A thermal interface material is applied between a heat sink with an opening and a flip chip. The opening partially exposes the back surface of the flip chip for measuring the BLT of the thermal interface material.

The second purpose of the present invention is to provide a flip chip package capable of measuring the bond line thickness (BLT) of the thermal interface material. A heat sink having an opening is attached to a flip chip. The back surface of the flip chip includes a region uncovered by the thermal interface material, which may includes an edge or a corner of the back surface. The opening exposes the uncovered region of the back surface. Therefore, the thickness distribution of the thermal interface material can be easily observed.

The third purpose of the present invention is to provide a flip chip package capable of measuring the bond line thickness (BLT) of the thermal interface material. The opening of the heat sink has an inner sidewall. The inner sidewall is positioned above the back surface of the flip chip, and the horizontal distance between the inner sidewall and the uncovered edge of the back surface is over 10 mil. Since the inner sidewall provides enough bleeding distances for thermal interface material, the thermal interface material has a fillet height on the inner sidewall and will not completely cover the back surface of the flip chip.

The fourth purpose of the present invention is to provide a flip chip package capable of measuring the bond line thickness (BLT) of the thermal interface material. The heat sink has at least an opening corresponding to the edge or the corner of the back surface of the flip chip to reduce any possible warpage of the heat sink.

According to the present invention, a flip chip package comprises a substrate, a flip chip, a thermal interface material, and a heat sink. The substrate has an upper surface and a lower surface. The flip chip has an active surface, a back surface and a plurality of bumps on the active surface. The flip chip is flipped mounted on the upper surface of the substrate via the bumps. The thermal interface material is applied on the back surface of the flip chip. Preferably, the thermal interface material does not completely cover the back surface of the flip chip. The heat sink has a first surface, a second surface and at least an opening through the first and the second surfaces. The second surface of the heat sink is attached to the thermal interface material to enhance the heat dissipation of the flip chip. The opening partially exposes the back surface of the flip chip without covering the thermal interface material. The opening has an inner sidewall which is positioned above the back surface of the flip chip. Preferably, the horizontal distance between the inner sidewall and the adjacent edge of the back surface of the flip chip is over 10 mil so that the thermal interface material can be extended to the inner sidewall to form a bleeding height but not completely covering the back surface of the flip chip. The back surface includes an uncovered region exposed out of the opening so that the bond line thickness of the thermal interface material can be measured.

DETAILED DESCRIPTION OF THE PRESENT INVENTION

Figure 1:
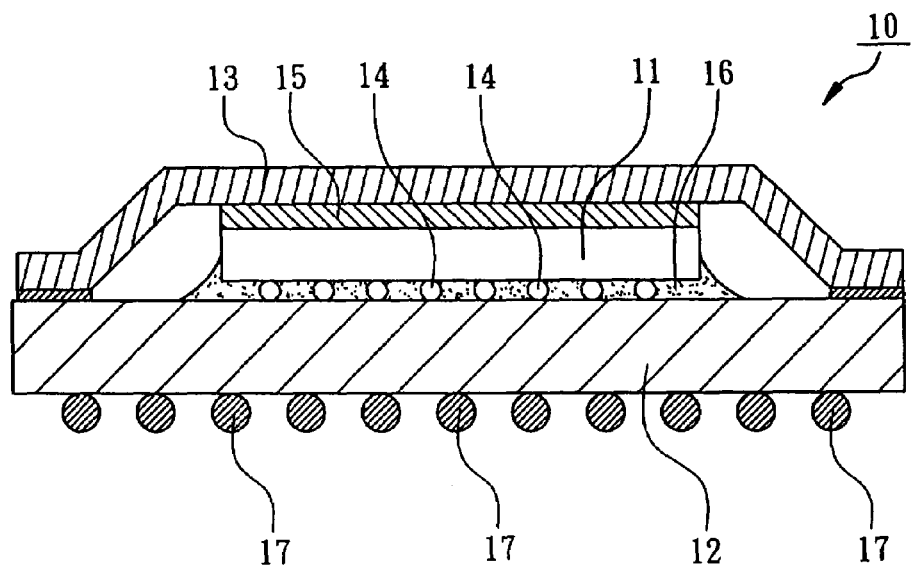
FIG. 1 is a cross-sectional view of a conventional flip chip package.
Figure 2:
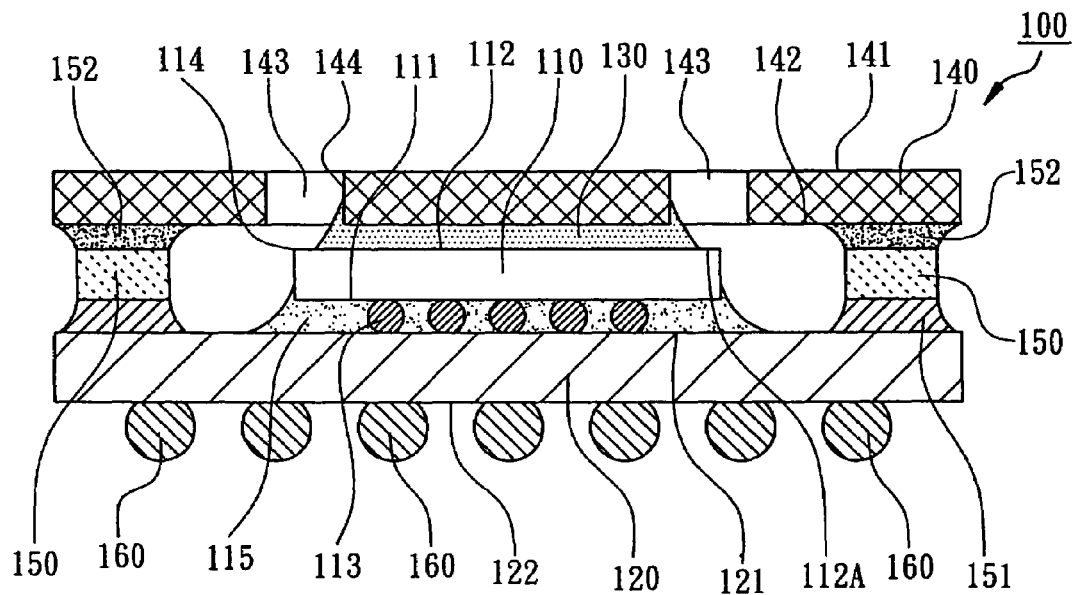
FIG. 2 is a cross-sectional view of a flip chip package capable of measuring the bond line thickness of the thermal interface material according to the first embodiment of the present invention.
Figure 3:
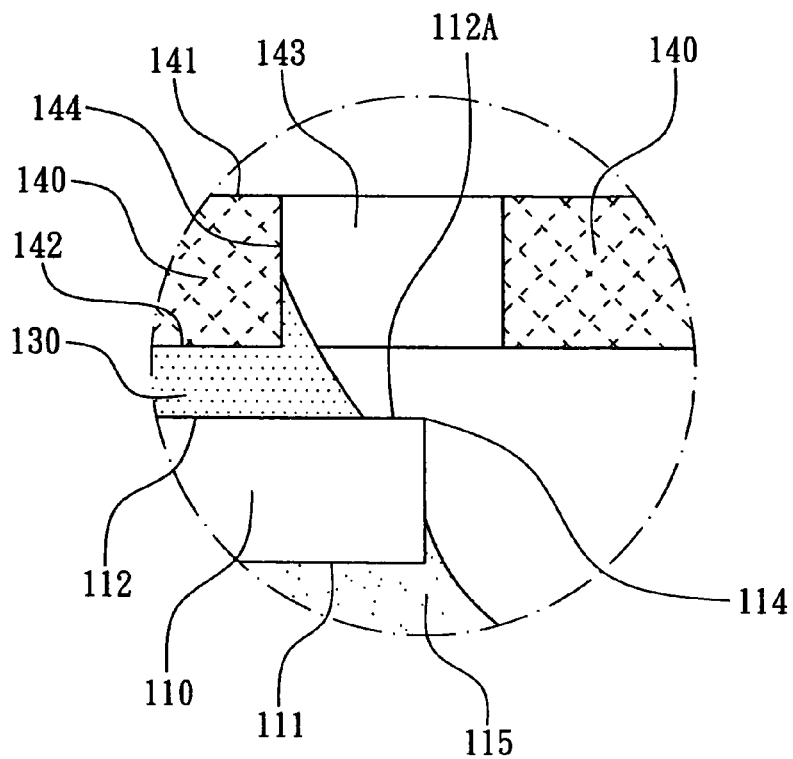
FIG. 3 is an enlarged cross-sectional view of the flip chip package according to the first embodiment of the present invention.
Figure 4:
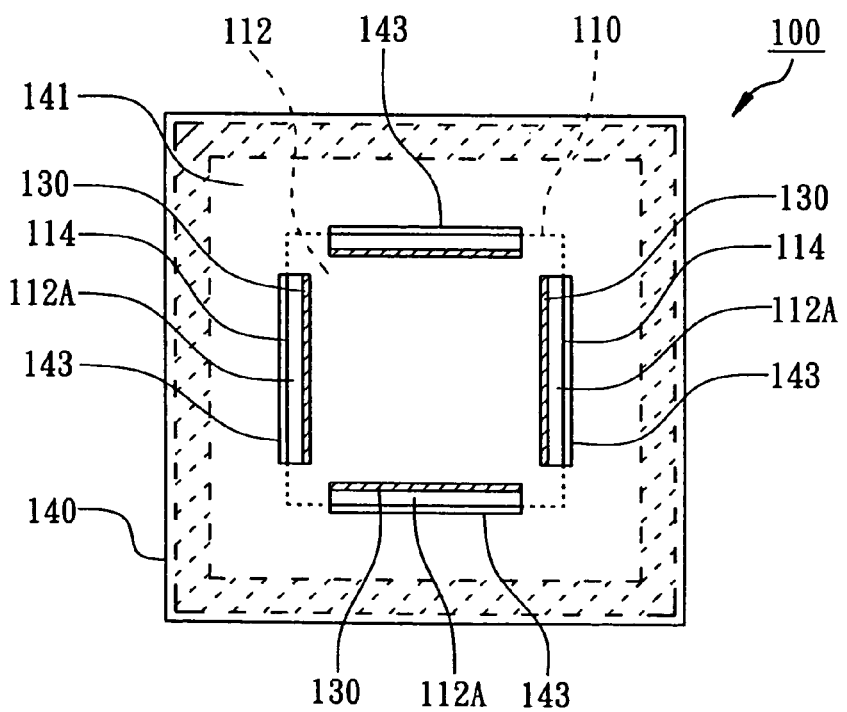
FIG. 4 is a top view of the flip chip package according to the first embodiment of the present invention.

FIGS. 2, 3, and 4 show a flip chip package 100 capable of measuring the bond line thickness according to a first embodiment of the present invention. The flip chip package 100 comprises a flip chip 110, a substrate 120, a thermal interface material 130, and a heat sink 140. The substrate 120 has an upper surface 121 and a lower surface 122. The substrate 120 has a plurality of flip-chip pads on the upper surface 121 for flip-chip bonding the flip chip 110. The flip chip 110 has an active surface 111 and a back surface 112. A plurality of bumps 113 are formed on the active surface 111. The back surface 112 includes a plurality of edges 114 and a plurality of corners between the edges 114. The flip chip 110 is mounted on the upper surface 121 of the substrate 120 via the bumps 113. Preferably, there is an underfilling material 115 applied between the active surface 111 of the flip chip 110 and the upper surface 121 of the substrate 120 to reduce the stress on the bumps 113.

The thermal interface material 130 (TIM) is applied on the back surface 112 of the flip chip 110, which has excellent thermal conductivity for transmitting the heat from the flip chip 110. In this embodiment, the thermal interface material 130 is a thermosetting liquid compound. The thermal interface material 130 is dispensed on the back surface 112 of the flip chip 110 in liquid form and then is cured after attaching the heat sink 140. Thus the thermal interface material 130 can conduct the heat from the flip chip 110 to the heat sink 140. According to the present invention, the heat sink 140 has at least an opening 143 in a proper location to prevent the thermal interface material 130 from completely covering the back surface 112 of the flip chip 110 even the thermal interface material 130 will bleed in the opening 143.

The heat sink 140 is disposed on the upper surface 121 of the substrate 120. In this embodiment, a stiffener ring 150 is attached to the upper surface 121 of the substrate 120 around the flip chip 110 for supporting the heat sink 140. An adhesive 151 bonds the stiffener ring 150 to the upper surface 121 of the substrate 120, and another adhesive 152 bonds the stiffener ring 150 and the heat sink 140 together. The heat sink 140 has a first surface 141 and a second surface 142, and the openings 143 passing through the first surface 141 and the second surface 142. The second surface 142 of the heat sink 140 is attached to the thermal interface material 130. Each opening 143 has an inner sidewall 144 above the upper surface 112 of the flip chip 110. In this embodiment, the openings 143 are straight slots parallel to the corresponding uncovered edges 114 of the back surface 112 as shown in FIG. 4. Referring to FIG. 3, the back surface 112 includes a region 112A uncovered by thermal interface material 130, the uncovered region 112A may includes one of the edges 114 or a corner of the back surface 112. The uncovered region 112A is exposed out of the corresponding openings 143 of the heat sink 140. Preferably, the horizontal distance between the inner sidewalls 144 and the corresponding adjacent edges 114 of the back surface 112 is over 10 mil, so that the thermal interface material 130 can be extended to the inner sidewalls 144 of the openings 143 to form a fillet height but not completely covering the back surface 112. When the heat sink 140 is attached to the thermal interface material 130, some of the thermal interface material 130 will bleed and extend to the inner sidewalls 144 of the opening 143 because of the capillary effect. Then, using a measuring microscope (not shown in the drawing), the back surface 112 (uncovered region 112A) of the flip chip 110 can be measured from the openings 143 of the heat sink 140 to obtain the Z-axis height of the back surface 112 of the flip chip 110. The difference between the Z-axis height of the back surface 112 and the first surface 141 of the heat sink 140 can be calculated. Afterwards, by subtracting the thickness of the heat sink 140 from the difference mentioned above, the BLT of the thermal interface material 130 can be obtained.

Therefore, the best volume of thermal interface material 130 can be calculated to replace conventional destructive methods including removing the heat sink, preheating, and cross-section scanning, used to measure the BLT and the bleeding condition of the thermal interface material on the back surface of the flip chip. Therefore, the flip chip package is designed to measure the thickness of the thermal interface material with nondestructive methods. Moreover, a plurality of solder balls 160 can be placed on the lower surface 122 of the substrate 120 for outer electrical connection of the flip chip package 100. In this embodiment, the heat sink 140 has four straight-slotted openings 143 corresponding to the four edges 114 of the back surface 112 of the flip chip 110. The uncovered region 112A uncovered by the thermal interface material 130 can be exposed out of the openings 143 to observe the bleeding height and distribution of the thermal interface material 130 over the inner sidewall 144 of the opening 143 and to prevent the warpage of the heat sink 140 resulting from the difference of thermal expansion between the heat sink 140 and the thermal interface material 130.

Figure 5:
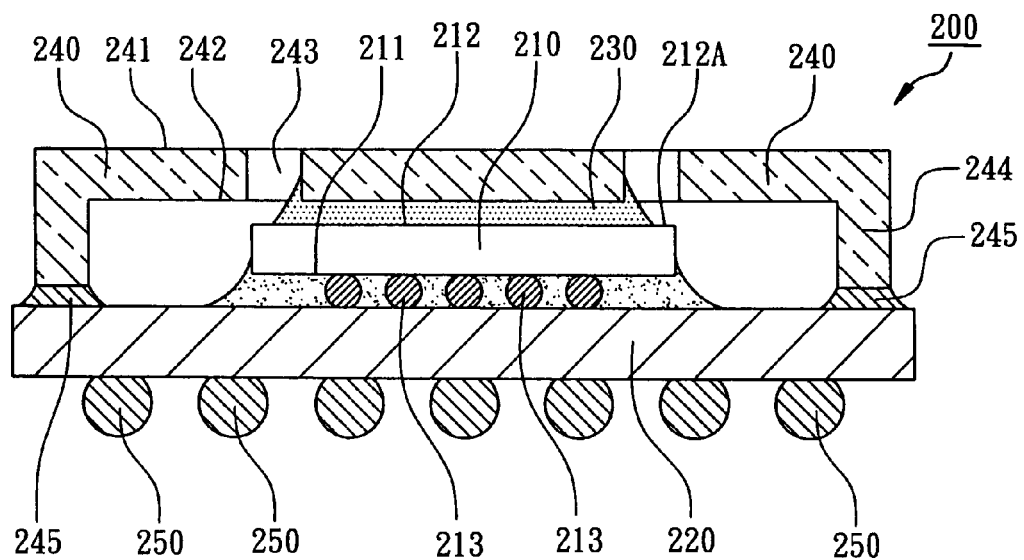
FIG. 5 is a cross-sectional view of a flip chip package capable of measuring the bond line thickness of the thermal interface material according to the second embodiment of the present invention.

In the second embodiment of the present invention, FIG. 5 shows a flip chip package 200 capable of measuring the thickness of the thermal interface material. It comprises a flip chip 210, a substrate 220, a thermal interface material 230, and a heat sink 240. The flip chip 210 has an active surface 211 and a back surface 212. The flip chip 210 is mounted on the active surface 221 of the substrate 220 via a plurality of bumps 213. The thermal interface material 230 is dispensed on the back surface 212 of the flip chip 210. The heat sink 240 has a first surface 241, a second surface 242 and at least an opening 243 passing through the first surface 214 and the second surface 242. And the second surface 242 of the heat sink 240 is attached to the thermal interface material 230. Furthermore, the back surface 212 of the flip chip 210 includes a region 212A uncovered from the thermal interface material 230, also the uncover region 212A is exposed out of the opening 243 of the heat sink 240. In this embodiment, the thermal interface material 230 is a thermal grease which has excellent thermal conductivity. Moreover, the heat sink 240 has an extensive connection part 244 attached to the substrate 220 with an adhesive compound 245. The Z-axis height difference between the first surface 241 of the heat sink 240 and the back surface 212 (uncovered region 212A) of the flip chip 210 enables to be measured. Afterwards, by subtracting the thickness of the heat sink 240 from the measured height difference, the BLT of the thermal interface material 230 can be obtained. Preferably, a plurality of solder balls 260 is placed on the substrate 220 to provide outer electrical connection of the package 220.

Figure 6:
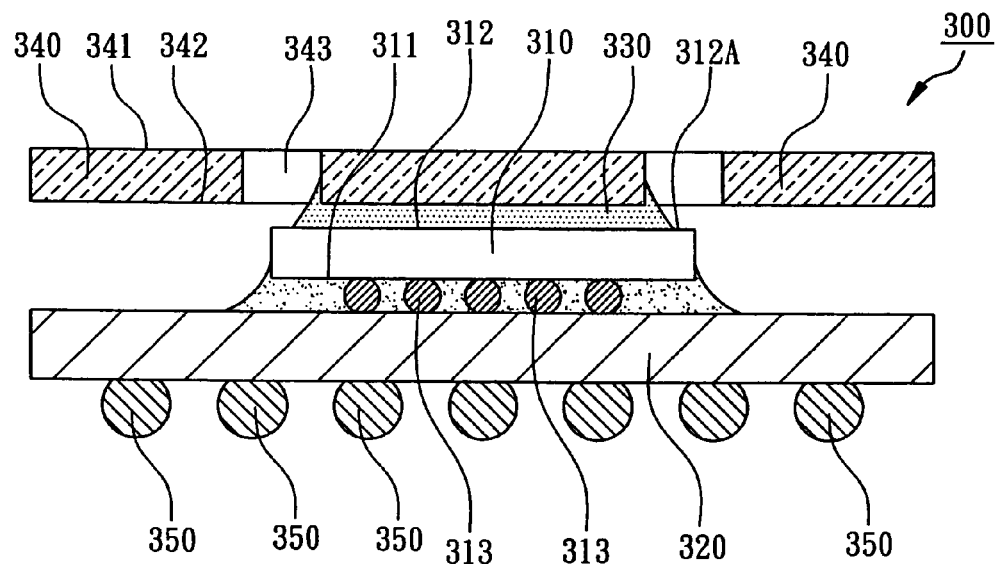
FIG. 6 is a cross-sectional view of a flip chip package capable of measuring the bond line thickness of the thermal interface material according to the third embodiment of the present invention.

In the third embodiment of the present invention, FIG. 6 shows a flip chip package 300 capable of measuring the thickness of the thermal interface material. The package 300 comprises a flip chip 310, a substrate 320, a thermal interface material 330, and a heat sink 340. The flip chip 310 has an active surface 311 and a back surface 312. The flip chip 310 is mounted on the active surface 321 of the substrate 320 via the bumps 313. The heat sink 340 has a first surface 341, a second surface 342 and at least an opening 343 passing through the first surface 314 and the second surface 342. The thermal interface material 330 is applied between the back surface 312 of the flip chip 310 and the second surface 342 of the heat sink 340. The back surface 312 of the flip chip 310 includes a region 312A uncovered from the thermal interface material 330, also the uncovered region 312A is exposed out of the opening 343 of the heat sink 340. The uncovered region 312A enables to be measured to obtain Z-axis height of the back surface 312 of the flip chip 310. The Z-axis height difference between the first surface 341 of the heat sink 340 and the back surface 312 (uncovered region 312A) of the flip chip 330 is measured. Afterwards, by subtracting the thickness of the heat sink 340 from the measured height difference, the BLT of the thermal interface material 330 can be obtained. Preferably, a plurality of solder balls 360 can be placed on the substrate 320 to provide outer electrical connection of the package 320.

The protective coverage of the invention is based on the patent application coverage listed afterwards. Any technology even with any trivial changes, which are similar to this invention, is covered under this protective coverage as long as it is within the spirit and the coverage of this invention.

What is claimed is:

1. A flip chip package comprising:
    a substrate having an upper surface and a lower surface;
    a flip chip having an active surface and a back surface, wherein the flip chip is mounted on the upper surface of the substrate;
    a thermal interface material applied on a predetermined part of the back surface of the flip chip; and
    a heat sink having a first surface, a second surface and at least one opening through the first and second surfaces, wherein the second surface of the heat sink is attached to the thermal interface material, an uncovered region of the back surface of the flip chip aligns with and is exposed through the at least one opening,
    wherein the uncovered region of the back surface of the flip chip further includes a region uncovered by the thermal interface material, wherein the opening has an inner sidewall above the back surface of the flip chip, and wherein the thermal interface material is extended to the inner sidewall of the heat sink to form a fillet height.

2. The package of claim 1, wherein the uncovered region is exposed through the at least one opening.

3. The package of claim 1, wherein the uncovered region includes an edge of the back surface.

4. The package of claim 1, wherein the flip chip has at least one corner, the uncovered region includes at least one of the at least one corner of the back surface.

5. The package of claim 1, wherein the opening is a straight slot parallel to the uncovered edge of the back surface.

6. The package of claim 1, wherein the horizontal distance between the inner sidewall and the uncovered edge of the back surface is over 10 mil.

7. The package of claim 1, wherein the thermal interface material is a thermosetting liquid compound.

8. The package of claim 1, wherein the heat sink is connected to the upper surface to the substrate.

9. The package of claim 1, further comprising a stiffener ring connecting the heat sink and the substrate.

10. The package of claim 1, further comprising an underfilling material between the flip chip and the substrate.

11. The package of claim 1, further comprising a plurality of solder balls placed on the lower surface of the substrate.

12. A flip chip package comprising:
    a substrate having an upper surface and a lower surface;
    a flip chip having an active surface and a back surface, wherein the flip chip is mounted on the upper surface of the substrate;
    a thermal interface material applied on a predetermined part of the back surface of the flip chip;
    a heat sink having a first surface, a second surface and at least one opening through the first and second surfaces, wherein the second surface of the heat sink is attached to the thermal interface material, a predetermined part of the back surface of the flip chip aligns with and is exposed through the at least one opening; and
    a stiffener ring connecting the heat sink and the substrate.

13. The package of claim 12, wherein the back surface of the flip chip includes a region uncovered by the thermal interface material.

14. The package of claim 13, wherein the uncovered region is exposed through the opening.

15. The package of claim 13, wherein the uncovered region includes an edge of the back surface.

16. The package of claim 13, wherein the flip chip has at least one corner, the uncovered region includes at least one of the at least one corner of the back surface.

17. The package of claim 15, wherein the opening is a straight slot parallel to the uncovered edge of the back surface.

* * * * *